(12) United States Patent
Boyer et al.

(10) Patent No.: US 10,885,440 B2
(45) Date of Patent: Jan. 5, 2021

(54) CONTEXTUAL EVALUATION OF PROCESS MODEL FOR GENERATION AND EXTRACTION OF PROJECT MANAGEMENT ARTIFACTS

(71) Applicant: INTERNATIONAL BUSINESS MACHINES CORPORATION, Armonk, NY (US)

(72) Inventors: Jerome Boyer, Santa Clara, CA (US); Robert H. Grant, Austin, TX (US); Vyacheslav A. Zheltonogov, Allen, TX (US)

(73) Assignee: International Business Machines Corporation, Armonk, NY (US)

( * ) Notice: Subject to any disclaimer, the term of this patent is extended or adjusted under 35 U.S.C. 154(b) by 775 days.

(21) Appl. No.: 15/188,572

(22) Filed: Jun. 21, 2016

(65) Prior Publication Data
US 2017/0364824 A1 Dec. 21, 2017

(51) Int. Cl.
*G06N 5/02* (2006.01)
*G06N 20/00* (2019.01)
(Continued)

(52) U.S. Cl.
CPC .................. *G06N 5/02* (2013.01); *G06N 5/00* (2013.01); *G06N 20/00* (2019.01); *G06Q 10/067* (2013.01); *G06Q 10/06311* (2013.01)

(58) Field of Classification Search
CPC ........... G06Q 10/067; G06Q 10/06311; G06Q 10/0833; G06F 17/5009; G06F 30/20;
(Continued)

(56) References Cited

U.S. PATENT DOCUMENTS 8,516,435 B2 8/2013 Akkiraju et al.
9,026,483 B1* 5/2015 Cohen .............. G06Q 10/06375
706/46
(Continued)

OTHER PUBLICATIONS

Translate from BPMN to UML, http:slideshare.net/dinhvuong1206/team2-final-bpmn2uml. Published Oct. 28, 2013, 11 pages.
(Continued)

*Primary Examiner* — Shane D Woolwine
(74) *Attorney, Agent, or Firm* — Heslin Rothenberg Farley & Mesiti P.C.; Brian Restauro, Esq.

(57) ABSTRACT

A computer-implemented method includes a processor extracting data and metadata from a process model, where the process is comprised of activities and the metadata is associated with each activity. The processor generates at least one user story for at least one activity, where the at least one user story includes an estimate attribute reflecting a predicted timeframe for completion of at least a portion of the at least one activity. The processor updates the model to reflect the at least one user story and displays the updated model as a project plan in a project management interface on a computing resource. The processor assigns a resource to the at least one user story and dynamically updates the estimate attribute of the at least one user story to reflect a new predicted timeframe, calculates impacts to the process and displays the impacts and the new predicted timeframe in the project management interface.

18 Claims, 11 Drawing Sheets

(51) Int. Cl.
*G06N 5/00* (2006.01)
*G06Q 10/06* (2012.01)

(58) Field of Classification Search
CPC ............ G06N 5/00; G06N 5/02; G06N 20/00; G06N 20/10; G06N 20/20
See application file for complete search history.

(56) References Cited

U.S. PATENT DOCUMENTS

| | | | |
|---|---|---|---|
| 2008/0077451 A1* | 3/2008 | Anthony | G06Q 10/10 705/4 |
| 2008/0208660 A1 | 8/2008 | Kano et al. | |
| 2009/0037237 A1 | 2/2009 | Weber et al. | |
| 2011/0161132 A1 | 6/2011 | Goel et al. | |
| 2012/0095956 A1* | 4/2012 | Xiong | G06Q 10/067 707/600 |
| 2014/0208418 A1* | 7/2014 | Libin | G06F 21/6209 726/19 |
| 2015/0066563 A1* | 3/2015 | McLees | G06Q 10/00 705/7.23 |
| 2015/0127583 A1* | 5/2015 | Allgaier | G06N 5/04 706/11 |
| 2015/0310359 A1* | 10/2015 | Furbeck | G06Q 50/04 705/7.26 |

OTHER PUBLICATIONS

ATL Use Case From UML Activity Diagram to Project Management Software, http://www.eclipse.org/atl/usecases/UML2MsProject/. 2 pages.
Aysolmaz et al., UPROM Tool: A Unified Business Process Modeling Tool for Generating Software Life Cycle Artifacts, 8 pages.
Nguyen Quoc Bao, A Proposal for a Method to Translate BPMN Model into UML Activity Diagram, Vietnamese-German University—BIS 2010, 11 pages.
Translate from BPMN to UML Presentation, Professor Benz, 27 pages.

* cited by examiner

CONTEXTUAL EVALUATION OF PROCESS MODEL FOR GENERATION AND EXTRACTION OF PROJECT MANAGEMENT ARTIFACTS

TECHNICAL FIELD

One or more aspects of the present invention relate to automated extraction of contextual semantic information from process models to improve dynamic measures of projects.

BACKGROUND

Software applications enable the modeling of business processes and the creation of project plans for projects. Generally, these models are separate and there is no interface between them to reflect dependencies between them, although dependencies exist, including certain aspects of a process or project that affect the timelines and deliverables. Anticipating dependencies in advance of issues can assist individuals involved in a project in adhering to the desired timeline.

SUMMARY

According to embodiments, shortcomings of the prior art are overcome and additional advantages are provided through the provision of a method of semantic extraction from a process model to create and dynamically update a project plan for the process implementation. The method includes, for instance, in some embodiments: extracting, by one or more processor, with semantic extraction, data and metadata from a model representing a process, wherein the process is comprised of activities and the metadata is associated with each activity; based on the semantic extraction, generating, by the one or more processor, at least one user story for at least one activity, wherein the at least one user story comprises an estimate attribute reflecting a predicted timeframe for completion of at least a portion of the at least one activity; updating, by the one or more processor, the model to reflect the at least one user story, the updating comprising displaying the updated model as a project plan in a project management interface on a computing resource; assigning, by the one or more processor, a resource to the at least one user story; dynamically updating, by the one or more processor, the estimate attribute of the at least one user story to reflect a new predicted timeframe, wherein the dynamic updating is based on attributes of the resource; and updating, by the one or more processor, the at least one user story to reflect the new predicted timeframe, calculating impacts to the process, based on the new predicted timeframe, and displaying the impacts and the new predicted timeframe in the project management interface.

According to embodiments, shortcomings of the prior art are overcome and additional advantages are provided through the provision of a computer program product to perform semantic extraction from a process model to create and dynamically update a project plan for the process. The computer program product includes, for instance, in some embodiments, a computer readable storage medium readable by one or more processor and storing instructions for execution by the one or more processor for performing a method that includes: extracting, by one or more processor, with semantic extraction, data and metadata from a model representing a process, wherein the process is comprised of activities and the metadata is associated with each activity; based on the semantic extraction, generating, by the one or more processor, at least one user story for at least one activity, wherein the at least one user story comprises an estimate attribute reflecting a predicted timeframe for completion of at least a portion of the at least one activity; updating, by the one or more processor, the model to reflect the at least one user story, the updating comprising displaying the updated model as a project plan in a project management interface on a computing resource; assigning, by the one or more processor, a resource to the at least one user story; dynamically updating, by the one or more processor, the estimate attribute of the at least one user story to reflect a new predicted timeframe, wherein the dynamic updating is based on attributes of the resource; and updating, by the one or more processor, the at least one user story to reflect the new predicted timeframe, calculating impacts to the process, based on the new predicted timeframe, and displaying the impacts and the new predicted timeframe in the project management interface.

According to embodiments, shortcomings of the prior art are overcome and additional advantages are provided through the provision of a system for estimating resource cost for a project. The system includes a memory, one or more processor in communication with the memory, and program instructions executable by the one or more processor via the memory to perform a method. The method includes, for instance: obtaining, by the one or more processor, at least one document comprising a plain language description of a project; analyzing, by the one or more processor, the at least one document to identify artifacts of the project; based on the identifying, deriving, by the one or more processor, a link between at least two of the artifacts, wherein the link represents a relationship between the at least two artifacts; generating, utilizing the artifacts and the link, by the one or more processor, a map, wherein the map comprises the artifacts and the link; querying, by the one or more processor, a database of historical process modeling data comprising historical maps associated with historical processes, to identify a portion of at least one historical map similar to a portion of the map, wherein the portion of the at least one historical map comprises resource cost information; based on identifying the portion of the at least one historical map as similar to the portion of the map, estimating, by the one or more processor, based the resource cost information, resource costs for a portion of the artifacts in the map, to determine a resource cost for the project; and configuring, by the one or more processor, the resource cost for the project for use within a process model of the project.

Computer systems and methods relating to one or more aspects of the technique are also described according to embodiments.

Additional features and are realized through the techniques of embodiments of the present invention. Other embodiments and aspects of the invention are described in detail herein.

BRIEF DESCRIPTION OF THE DRAWINGS

One or more aspects of embodiments of the present invention are particularly pointed out and distinctly claimed in the claims at the conclusion of the specification. The foregoing and objects, features, and advantages of one or more aspects of embodiments of the invention are apparent from the following detailed description taken in conjunction with the accompanying drawings in which:

DETAILED DESCRIPTION

Figure 1:
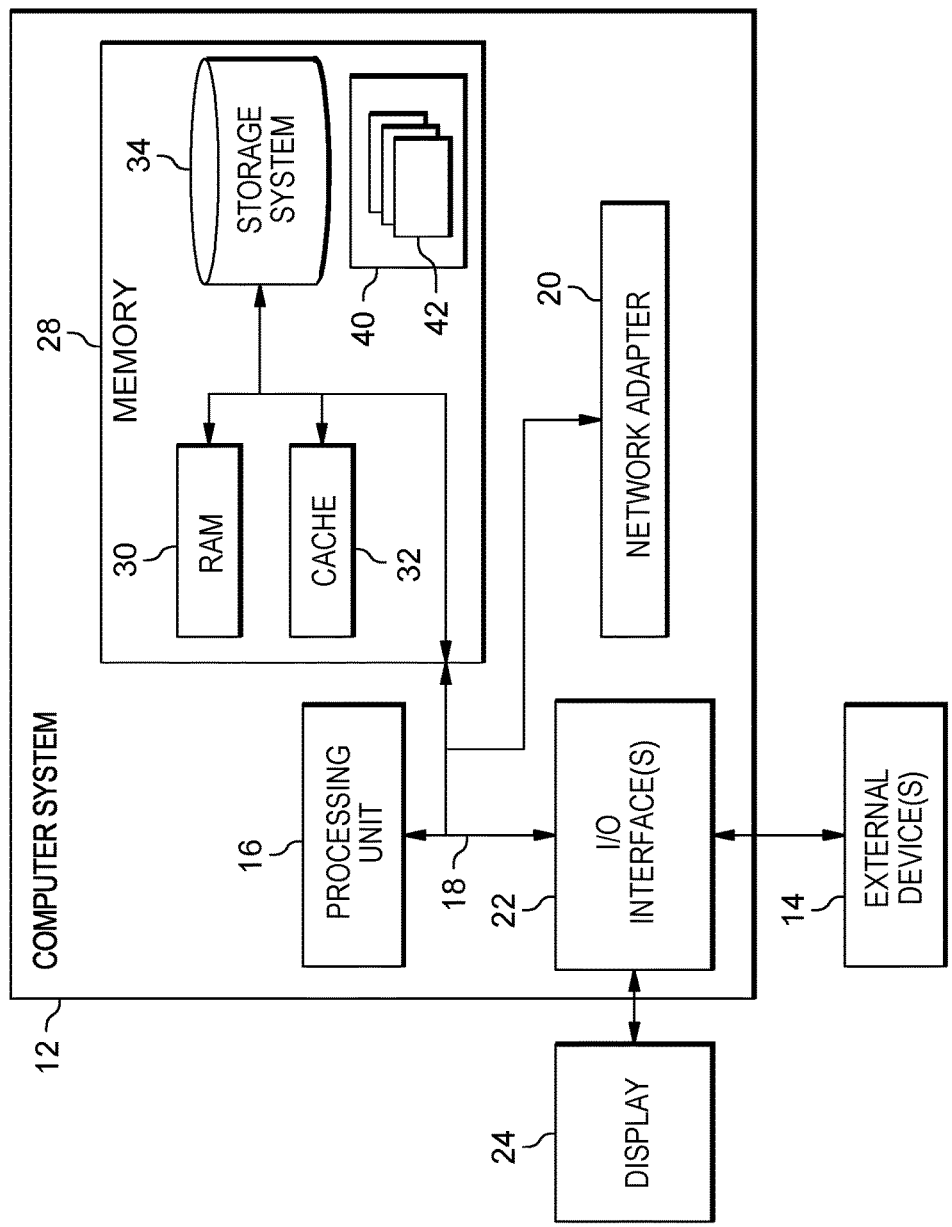
FIG. 1 depicts a cloud computing node, in accordance with one or more aspects set forth herein.

The accompanying figures, in which like reference numerals refer to identical or functionally similar elements throughout the separate views and which are incorporated in and form a part of the specification, further illustrate embodiments of the present invention and, together with the detailed description of the invention, serve to explain the principles of the embodiments.

Embodiments of the present invention include systems and methods that enable computer systems utilized to manage workflows to quantify, more accurately, the factors that affect individual tasks that comprise the workflow by injecting and considering additional characteristics in a project model. Aspects of embodiments of the present invention also provide methods for extracting contextual semantic information from a computer-generated graphical representation of a process and metadata of a business process model allowing for injection of organizational characteristics in a computer-implemented project management system.

Rather than rely on workflow estimates from individuals, which are subjective, and therefore vulnerable to error, embodiments of the present invention enable an accurate accounting of a process model, including of individual tasks within the model.

Embodiments of the present invention include a method for extracting contextual semantic information from the graphical representation and metadata of a business process model allowing for injection of organizational characteristics in a project management system. To this end, embodiments of the present invention include one or more programs 440 (e.g., FIG. 4) that enable extraction of any modeling semantics, transform data and metadata from a business process modeling semantic to a project management semantic, generate project management artifacts, perform contextual association (including but not limited to application context, developer cognition, feature context, artifact type context, and/or class construct context), and provide estimates that are usable in a project management tool.

As will be understood by one of skill in the art, aspects of the embodiments, including classifying user stories, assist in generating reliable estimates for tasks within a process because of the inclusion of the user stories in the process model. User stories are project management artifacts that are a function of certain attributes relative to both a given task as well as to a resource to which the task is assigned within a process/project. In an embodiment of the present invention, a user story is a function of one or more of activity type, actor, feature, and goal. Factors that determine a user story also include attributes of individuals or resources who will perform various tasks in a project. Generally, when modeling a business process, a user story would be excluded from consideration because the characteristic of the user assigned a task which would affect the task can often be intangible or at least not comprised of data that can be accurately integrated into the system. Thus, any adjustments based on a user story would generally be made manually by a project manager, based upon personal, generally subjective, knowledge and subjective interpretation of this information. Not only can one or more programs 440 (described in FIG. 4) in certain embodiments of the present invention generate a user story, one or more programs 440 can also reintegrate the information gleaned from the user story that informs a given task into existing computerized methods for managing workflows and process models. Thus, certain embodiments of the present invention improve existing computer technology by implementing an enhanced and more accurate process modeling method that increases the efficiency of resource distribution within a computing environment by providing additional, objective, intelligence to process models that formerly relied on subjective (and arguably often inaccurate) information sources.

Embodiments of the present invention represent an advance in computing technology by integrating together elements of systems responsible for shepherding different portions of a given process through completion. An advantage of certain embodiments of the present invention is that existing context extraction tools can be utilized. For example, in an embodiment of the present invention, a process may be described utilizing Business Process Model and Notation (BPMN) tasks, but in previous methods of process modeling, the parameters of these tasks were not informed by user stories. To model the integration of services, one or more programs 440 utilize interface characteristics for each activity/task that can be affected by an assigned user or resource and one or more programs 440 derive this information from user stories. To this end, in an embodiment of the present invention the one or more programs 440 perform text meaning extraction, and can do so utilizing known tools, including but not limited to, the IBM Watson® Application Program Interface (API), a product of International Business Machines Corporation. IBM Watson® is a registered trademark of International Business Machines Corporation, Armonk, N.Y., US. Certain embodiments of the present invention also include custom cognitive agents, however, the utilization of known tools can decrease implementation costs.

The data extraction and analysis characteristics of the IBM Watson® API would provide the advantage of enabling one or more programs 440 (described in FIG. 4) to match the aforementioned user stories with historical data, with a certain confidence level, thus adding additional intelligence to any tasks within a given process and therefore, to the process as a whole. For example, in an embodiment of the present invention that utilizes established metrics to reflect confidence levels, e.g., classifying a developer assigned a task in a process with a rating of "average" based on over four years as a software developer. The one or more programs 440, utilizing, for example, the IBM Watson® API, could assess the complexity of the data by using machine learning technics and evolve estimates over time, per project/process iteration. Over time, the machine learning techniques would enable the one or more programs 440 to improve iteration estimation and to build historical data so when assessing complexity, generating more accurate results.

In an embodiment of the present invention, one or more programs 440 define an output of a user story or similar artifact as a function of, for example, activity type, actor, feature, and goal. The one or more programs 440 output a unique set of these artifacts, for example, as an output of a project management tool. The one or more programs' 440 artifacts each have estimation attribute that is relative to qualities of the resource assigned to the task, including but not limited to cognition, process context, type context, and feature context. For example, in an embodiment of the present invention, a resource's cognition is defined as a function of experience with the development platform associated with a given task, experience with the type of artifact created, the number of similar artifacts of that type, the number of similar artifacts of that context, and the load of the resource with respect to other tasks within the present process and additional processes that may impact the estimate attribute. During the process, the one or more programs 440 assign various resources to a given task and as the resource assignments change, the one or more programs 440 dynamically adjust the estimate attribute to reflect the change in the resource. In an embodiment of the present invention one or more programs 440 dynamically create user stories that take into account any changes in the attributes of artifacts associated with the task.

In an embodiment of the present invention, one or more programs 440 extract and analyze data from a business process model, including but not limited to, a BPMN model. In an embodiment of the present invention, the one or more programs 440 extract metadata from the process model to represent a product and application back log that can be utilized in project planning. Prior to the extraction and analysis, the one or more programs 440 may also generate the business process model by assessing the lifecycle of a given process, for example, the development cycle of a given software application, and creating a representation of the application using a modeling method (e.g., BPMN). A user and/or one or more programs 440 may provide metadata for each artifact classified as an activity in the business process model.

As part of extracting and analyzing the data and metadata in the process model, the one or more programs 440 analyze the metadata associated with the artifacts in the process model to ensure a contextual representation of the activity. The one or more programs 440 may also improve the integrity of the data extracted by removing duplicates. Upon extraction of the data, one or more programs 440 may create semantic and contextual linking between the activities to represent an artifact that is used in multiple places in the application. In an embodiment of the present invention, one or more programs 440 represent the management artifacts as user stories, including but not limited to, Agile User Stories.

By providing a method for extracting contextual semantic information from the graphical representation and metadata of a business process model allowing for injection of organizational characteristics in a project management system, embodiments of the present invention provide certain advantages over existing project management and process management and modeling systems. For example, some embodiments of the present invention include one or more programs 440 that comprise tools that perform a tool-based semantic analysis of any human-created user stories and automatically generate respective work items and estimates that impact the process model. Some embodiments of the present invention include one or more programs 440 that comprise tools that perform a tool-based semantic analysis of the business process model artifacts with missing user stories, e.g., intermediate and start message events, and automatically generate user stories. These stories can be utilized instead of human feedback for further estimation efforts, for example, one or more programs 440 submit the information generated by the tool(s) into an existing system, as a human-based feedback for further effort estimation purposes. Some embodiments of the present invention include one or more programs 440 that comprise tools that generate user stories for typical work items identified, based on the past project performance and cognitive analysis. Finally, some embodiments of the present invention include one or more programs 440 that comprise tools that estimate effort of work items and user stories generated by one or more programs 440 in an embodiment of the present invention.

In an embodiment of the present invention, historical data related to past projects and processes with some equivalent or similar data points, for example, artifacts and/or relationships between artifacts. In an embodiment of the present invention, one or more programs 440 obtain at least one document that includes a plain language description of a project. The one or more programs 440 analyze the document to identify artifacts of the project. Based on identifying the artifacts, the one or more programs 440 derive links between certain of these artifacts; the links represent relationships between these artifacts. The one or more programs 440 generate a map that includes the artifacts and the links. The one or more programs 440 query a database of historical process modeling data that includes historical maps associated with historical processes, and identify a portion of at least one historical map similar to a portion of the map. This identified portion of the at least one historical maps includes resource cost information. Based on identifying the portion of the at least one historical map as similar to the portion of the map, the one or more programs 440 estimates, based the resource cost information, resource costs for a portion of the artifacts in the map, to determine a resource cost for the project. The one or more programs 440 configure the resource cost for the project within a process model (e.g., a business process model).

Aspects of certain embodiments of the present invention represent improvements to computer-related technology by leveraging electronic data analyses, machine learning, and object modeling, including automated methods of data review and incorporating into this analysis data that is exclusive to computing technologies to provide more efficiently and accurately, to a user of a computing resource, in a multi-user environment, information of greater accuracy than could gleaned from resources outside of the computing environment. In the present invention, not only does the one or more program 440 perform data analysis more effectively because the analysis itself leverages the processing advantages of the computer system upon which it is executed, but the data that informs the analysis and informs the results of the system and method described are inextricably tied to computer technology. For example, as will be described in greater detail herein, in certain embodiments of the present invention, one or more program 440 extracts contextual semantic information from a graphical representation (model) of a process and metadata of the process model allowing, for injection of organizational characteristics in a project management system. In an embodiment of the present invention, based on the analysis and modeling associated with this additional information (e.g., artifacts and user stories) one or more program 440 may adjust activities, tasks, targets, etc., in a system calibrated to perform the process in the process model, including but not limited to a project management system. In an embodiment of the present invention, one or more program 440 may generate a recommendation for assignment of tasks within a given project based upon the impact of user stories and other artifacts upon the tasks, in order to meet pre-defined project goals.

Advantages of certain embodiments of the present invention may be realized in multi-user and multi-entity computing environments. In an embodiment of the present invention, the type of data that can be obtained and analyzed by the one or more program 440 is enhanced by the connectivity of a computer resource, illustrated by computing node 10 (FIG. 4) utilized by a user accessing an embodiment of the present invention. One computing environment in which advantages of certain embodiments can be realized is a cloud computing environment. In embodiments of the present invention one or more program 440 executing on a resource of a cloud could obtain and analyze historical data and user stories to determine the estimates to associate with project artifacts.

FIGS. 1-4 depict various aspects of computing, including cloud computing, in accordance with one or more aspects set forth herein.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system 12, which is operational with numerous other general purpose or special purpose computing system environments or configurations. Examples of well-known computing systems, environments, and/or configurations that may be suitable for use with computer system 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, mobile devices, personal data assistants, and distributed cloud computing environments that include any of the above systems or devices, and the like.

Computer system 12 may be described in the general context of computer system-executable instructions, such as program modules, being executed by a computer system. Generally, program modules may include routines, programs, objects, components, logic, data structures, and so on that perform particular tasks or implement particular abstract data types. Computer system 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system 12 in cloud computing node 10 is shown in the form of a general-purpose computing device. The components of computer system 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 12 typically includes a variety of computer system readable media. Such media may be any available media that is accessible by computer system 12, and it includes both volatile and non-volatile media, removable and non-removable media.

System memory 28 can include computer system readable media in the form of volatile memory, such as random access memory (RAM) 30 and/or cache memory 32. Computer system 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system 12 may also communicate with one or more external devices 14 such as a keyboard, a pointing device, a display 24, etc.; one or more devices that enable a user to interact with computer system 12; and/or any devices (e.g., network card, modem, etc.) that enable computer system 12 to communicate with one or more other computing devices. Such communication can occur via Input/Output (I/O) interfaces 22. Still yet, computer system 12 can communicate with one or more networks such as a local area network (LAN), a general wide area network (WAN), and/or a public network (e.g., the Internet) via network adapter 20. As depicted, network adapter 20 communicates with the other components of computer system 12 via bus 18. It should be understood that although not shown, other hardware and/or software components could be used in conjunction with computer system 12. Examples, include, but are not limited to: microcode, device drivers, redundant processing units, external disk drive arrays, RAID systems, tape drives, and data archival storage systems, etc.

Figure 2:
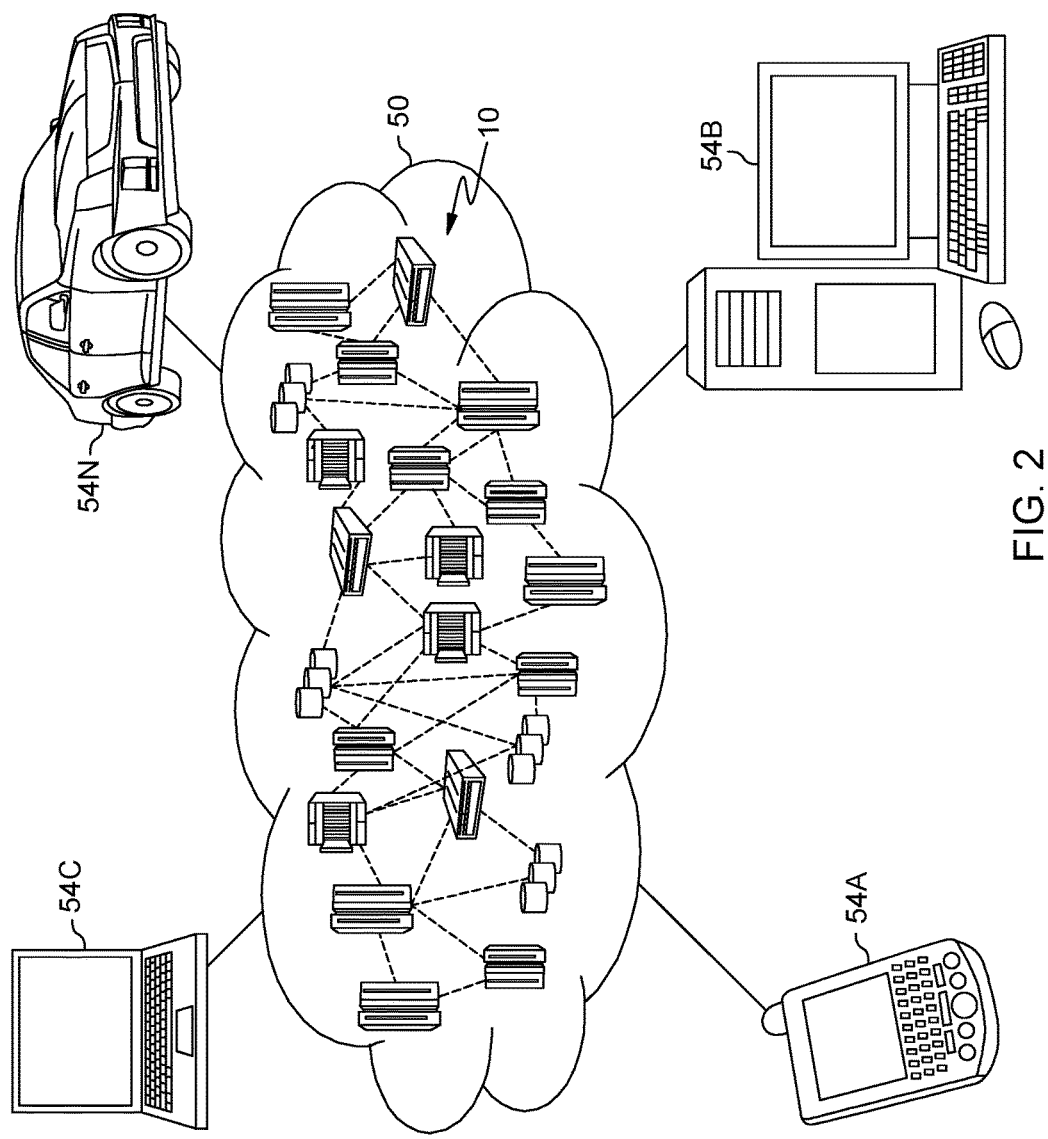
FIG. 2 depicts a cloud computing environment, in accordance with one or more aspects set forth herein.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
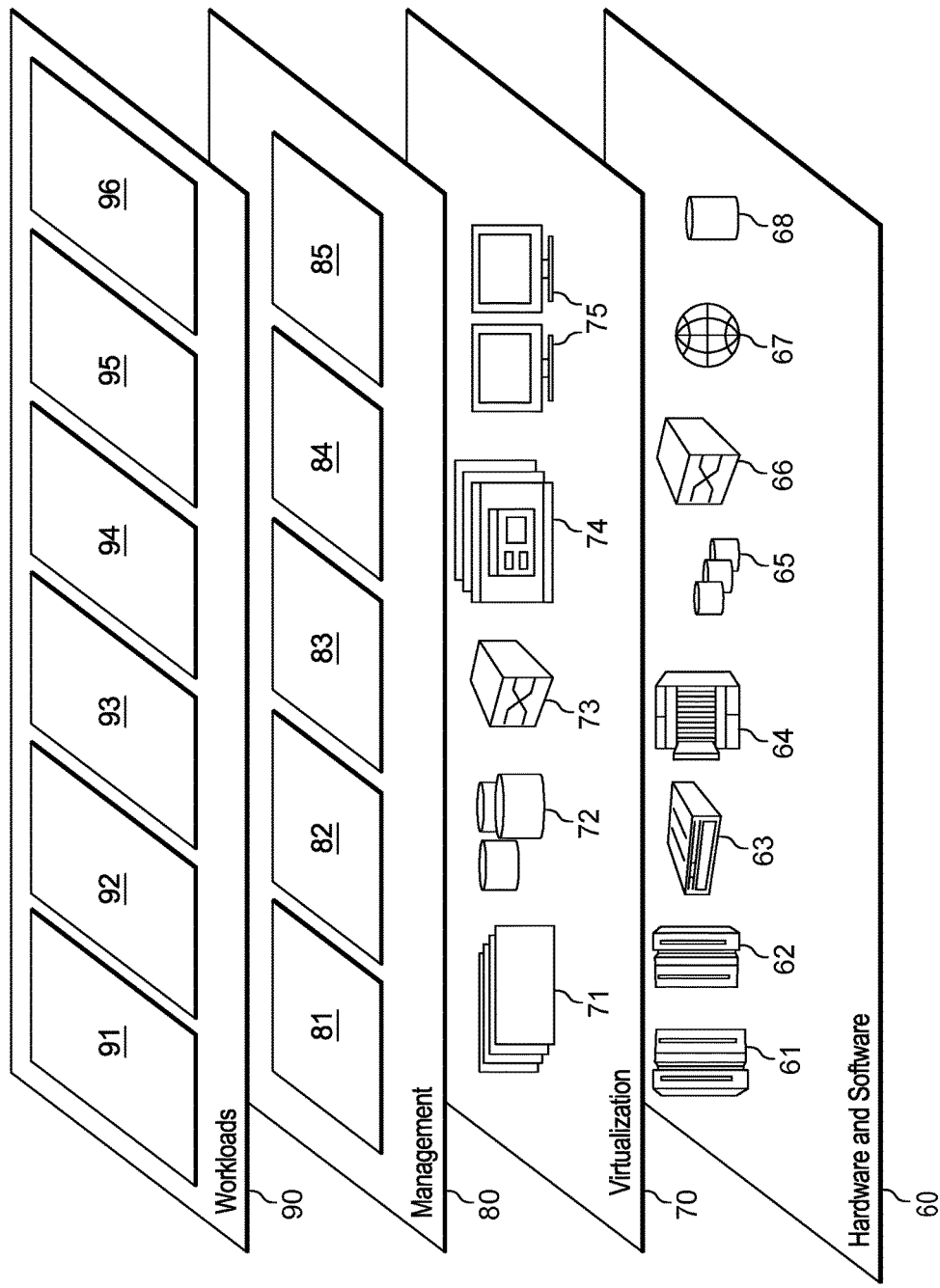
FIG. 3 depicts abstraction model layers, in accordance with one or more aspects set forth herein.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and performing semantic extraction from a process model to create and dynamically update a project plan for the process implementation 96, as described herein. Element 96 can be understood as one or more program 440 described in FIG. 4.

Figure 4:
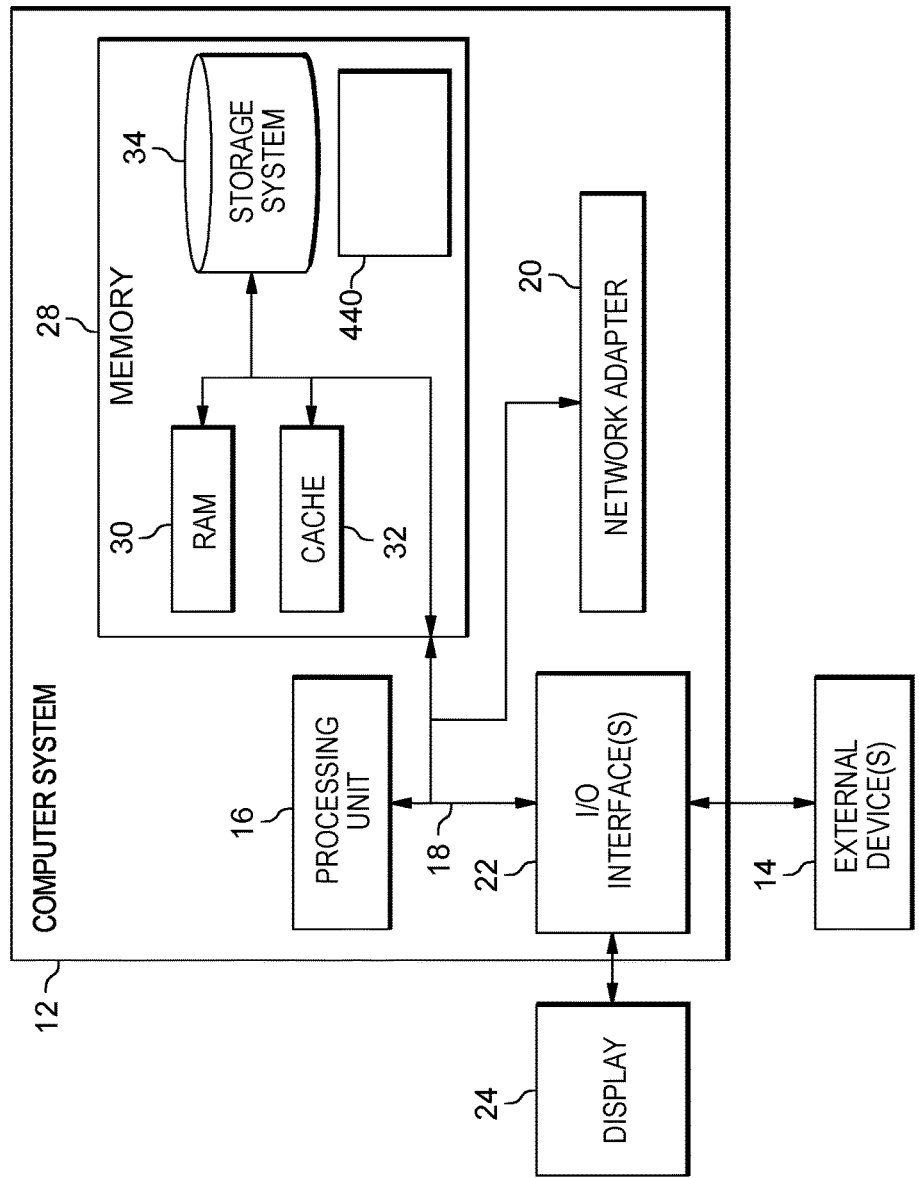
FIG. 4 depicts a hardware overview of a computing node, in accordance with one or more aspects set forth herein.

FIG. 4 depicts a hardware overview of a computing node 10, in accordance with one or more aspects set forth herein.

Program/utility 40 as set forth in FIG. 1 can include one or more program 440 as set forth in FIG. 4, and program/utility 40, including, for example one or more program 440 to evaluate the efficacy of the communications between one or more entities when transferring task ownership between these entities, as described in work layer 96. Program/utility 40 as set forth in FIG. 1 can optionally include additional programs.

One or more program 440 can have a set (at least one) of program modules, and may be stored in memory 28 by way of example, and not limitation, as well as an operating system, one or more application programs, other program modules, and program data. Each of the operating system, one or more application programs, other program modules, program data, and one or more program, or some combination thereof, may include an implementation of a networking environment. One or more program 440 generally carry out the functions and/or methodologies of embodiments of the invention as described herein.

Referring again to FIG. 4:

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

As will be illustrated in the figures that follow, in an embodiment of the present invention, one or more programs 440 (e.g., FIG. 4) extracts, with semantic extraction, data and metadata from a model representing a process, wherein the process is comprised of activities and the metadata is associated with each activity. Based on the semantic extraction, the one or more programs 440 generate at least one user story for at least one activity. The at least one user story includes an estimate attribute reflecting a predicted timeframe for completion of a portion of the at least one activity. The one or more programs 440 update the model to reflect the at least one user story, the updating includes displaying the updated model as a project plan in a project management interface on a computing resource. The one or more programs 440 assign a resource to the at least one user story and dynamically updates the estimate attribute of the at least one user story to reflect a new predicted timeframe, where the dynamic updating is based on attributes of the resource. The one or more programs 440 update the at least one user story to reflect the new predicted timeframe, calculate impacts to the process, based on the new predicted timeframe, and display the impacts and the new predicted timeframe in the project management interface.

In an embodiment of the present invention, the one or more program may also generate the model representing the process and the generating may include populating the metadata associated with each activity.

In an embodiment of the present invention, the estimate attribute is a function of at least one of: application context, resource cognition, feature context, artifact type context, and class construct context.

In an embodiment of the present invention, the one or more programs analyze the new predicted timeframe relative to attributes of the process and determine, based on new predicted timeframe, a probability that a milestone of the process will be missed. In this embodiment of the present invention, the one or more programs 440 generate a recommendation for a change to the process to decrease the probability and communicate the recommendation by displaying the recommendation in the project management interface.

In an embodiment of the present invention, the one or more programs 440 generate the at least one user story based on a function of at least one attribute of the at least one activity. The at least one activity may include, but is not limited to, activity that comprises type, actor, input, output, feature, and goal attributes.

In an embodiment of the present invention, the process metadata comprises at least one of: a process item, a process stakeholder, an input for each activity, an output for each activity, or an interface characteristic.

In an embodiment of the present invention based on the semantic extraction, the one or more programs 440 identify an activity in the process as a message event and display the message event in the project management interface on the computing resource without generating a user story.

In an embodiment of the present invention, the one or more programs 440, based on the semantic extraction, generate a project management artifact relevant to the process. In an embodiment of the present invention, as part of updating the model, the one or more programs 440 update the model to reflect a project management artifact other than a user story. This artifact may include a list of development tasks for the process, whether each activity constitutes a risk factor, and/or a recommendation to increase efficiency.

In an embodiment of the present invention, the one or more programs 440 may assign another resource to the at least one user story and dynamically update the estimate attribute of the at least one user story to reflect a different predicted timeframe in place of the new predicted timeframe, where the dynamic updating is based on attributes of the another resource.

In an embodiment of the present invention, the one or more programs 440 assign a score to the at least one user story and the score represents a level of anticipated risk associated with completing the portion of the at least one activity within the new predicted timeframe. In an aspect of another embodiment of the present invention, the one or more programs 440 obtain feedback related to the score continuously throughout the process. The one or more programs 440 extract, with semantic extraction, data and metadata from another model representing a subsequent process, where the subsequent process is comprised of additional activities and additional metadata is associated with each additional activity. Based on the semantic extraction, the one or more programs 440 generate at least one new user story for at least one additional activity, where the at least one new user story includes an estimate attribute reflecting a predicted timeframe for completion of a portion of the at least one additional activity, and where the at least one new user story and the at least one user story are equivalent or similar, including, for example where the at least one new user story and the at least one user story are substantially the same. The one or more programs 440 update the other model to reflect the at least one new user story, which includes displaying the updated other model as a project plan in a project management interface on a computing resource. The one or more programs 440 assign a new resource to the at least one new user story and dynamically update the estimate attribute of the at least one new user story to reflect a new predicted timeframe of the at least one new user story, where the dynamic updating is based on attributes of the new resource. The one or more programs 440 update the at least one new user story to reflect the new predicted timeframe of the at least one new user story. The one or more programs 440 assign based on the feedback and based on the score of the at least one user story, to the at least one new user story, a score, where the score of the at least one new user story represents a level of anticipated risk associated with completing the portion of the at least one additional activity within the new predicted timeframe of the at least one new user story.

Figure 5:
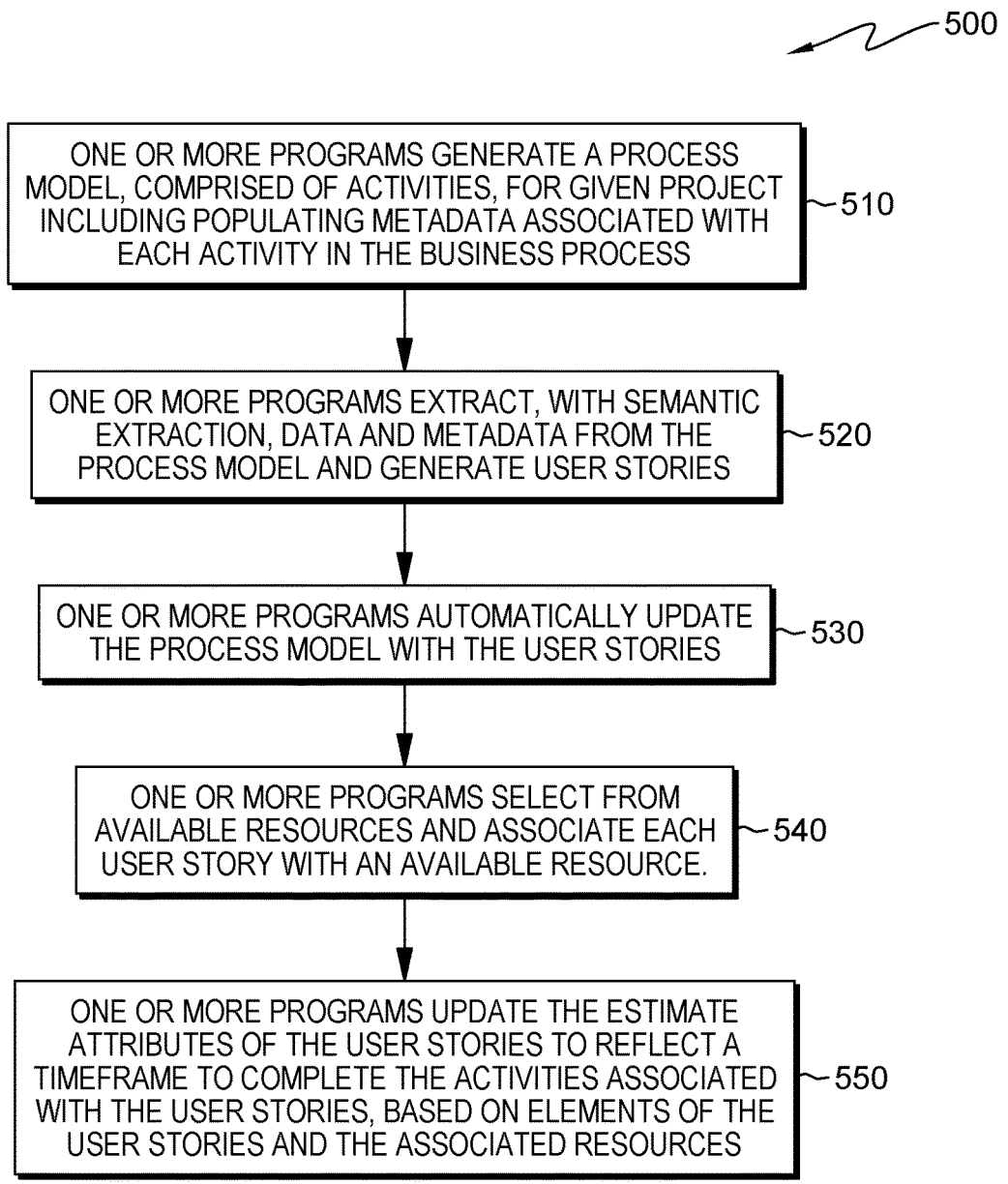
FIG. 5 depicts a workflow that illustrates aspects of an embodiment of the present invention.

FIGS. 5, 6, 7, and 9 depict workflows 500, 600, 700, and 900 incorporating various aspects of certain embodiments of the present invention. As discussed above, in embodiments of the present invention one or more programs 440 identify complexities in a process model that could impact parameters of a project, including estimation and delivery related to various tasks that comprise the project and the one or more programs 440 utilize these complexities to adjust a process model to account for impacts of these complexities. As depicted in FIG. 5, aspects of an embodiment of the present invention include extracting project management artifacts from a process model, which may include a graphical representation of an application and its business process model, utilizing the artifacts to define activities or tasks in the process that are performed to complete the process defined in the model, and generating an estimate for completing the defined activities with respect to the resource to which the activities are assigned. Certain embodiments of the present invention are orthogonal to any particular graphical representation of an application, for example, statistically independent of the graphical representation, but still dependent on feature-driven development style of project management outputs.

Figure 6:
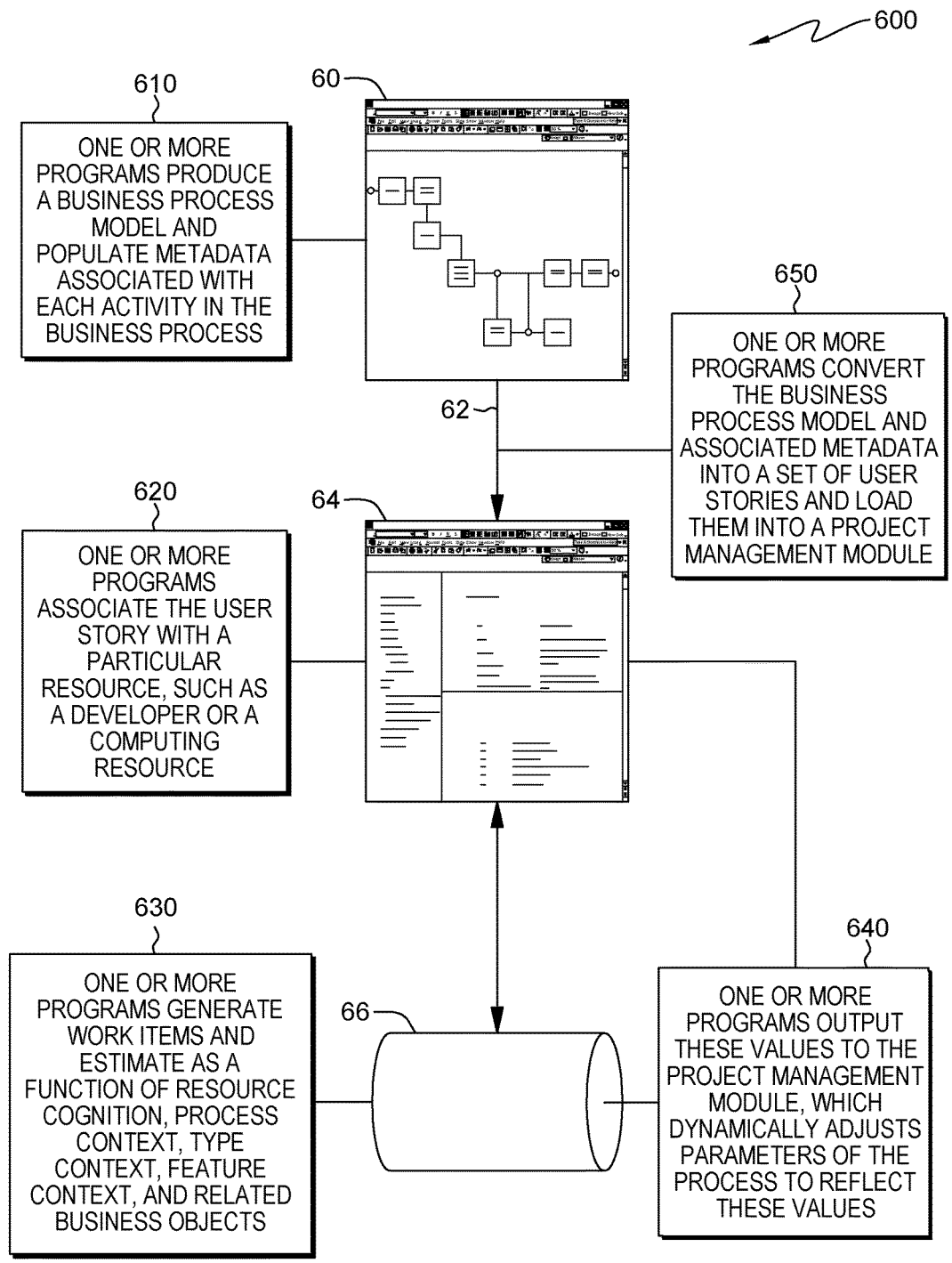
FIG. 6 depicts a workflow that illustrates aspects of an embodiment of the present invention.

Although the functionality discussed and attributed to aspects of embodiments of the present invention may be located in one or more programs 440 that form different systems and modules within a given computer system, for ease of understanding, embodiments discussed herein may be discussed in terms of three primary modules or systems that comprise certain embodiments of the present invention: 1) a process modeling module; 2) a project management module; and 3) an estimation module. FIG. 6 illustrates aspects of the present invention with specific reference to this modular approach.

As illustrated in FIG. 6, in an embodiment of the present invention, one or more programs 440 comprising the process modeling module 60 produce a business process model, including but not limited to a BPMN model and produce and populate metadata associated with each activity in the business process (610). The process modeling module 60 includes one or more programs 440 that can be understood as a semantic extractor 62 because these one or more programs 440 convert the business process model and associated metadata into a set of user stories and load them into a project management module 64 (620). One or more programs 440 in the project management module 66 (e.g., IBM® Rational Team Concert™ (RTC)) associate the user story with a particular resource, such as a developer or a computing resource (630). In additional, the project management module 64 may provide a user interface to manage the user stories. Internal or external to the project management module 64, an embodiment of the present invention includes an estimation module 66 that includes one or more programs 440 that generate work items and estimates as a function of resource cognition, process context, type context, feature context, and related business objects (640). One or more programs 440 in the estimation module 66 output these values to the project management module 64, which dynamically adjusts parameters of the process to reflect these values (650).

Referring to FIG. 5, one or more programs 440 (e.g., a process modeling module) generate a process model, comprised of activities, for given project including populating metadata associated with each activity in the business process (510). Process metadata may include, but is not limited to, process items (e.g., list of activities, human services, integrations to systems, events, and/or gateways), process stakeholders (e.g., a description of a group of users associated with a given activity), inputs and outputs for each activity in the process, systems involved (e.g., a list of systems into which the process should be integrated and/or which the activities of the process will impact), and interface characteristics (e.g., protocol, system type, data structure request/response model, interaction type, transaction characteristics, and/or state characteristics). In an embodiment of the present invention, each activity includes attributes, including but not limited to, type, actor, input, output, feature, and/or goal.

The one or more programs 440 (e.g., a process modeling module) extract, with semantic extraction, data and metadata from the process model and generate user stories (520). The one or more program 440 may generate more than one user story for each activity. In an embodiment of the present invention, based on a function of the attributes associated with each activity (e.g., type, actor, input, output, feature, and/or goal), one or more programs 440 generate one user story for each activity of the same attribute. In an embodiment of the present invention, each user story includes an attribute of estimate, which is a function of resource cognition, process context, type context, and feature context. In analyzing the process model, the one or more program 440 may recognize that certain of the activities in the process model should not have associated user stories as these activities do not includes the dependencies and attributes represented by the user stories. For example, the one or more programs 440 may identify certain activities as message events and for these events, the one or more programs 440 will not generate user stories.

In an embodiment of the present invention, a user story may represent only one artifact of many that the one or more programs 440 derive from performing a semantic analysis. Additional project management artifacts that the one or more programs 440 generate may include, but are not limited to, a list of development tasks, an estimate of process activities (part of the user stories), whether an item constitutes a risk factor, e.g., a top ten risk, and project recommendations to increase efficiencies. Regarding the first item, development tasks that the one or more programs 440 generate may include, but are not limited to: developing a business process deployment architecture, developing a user interface, developing a data model, assessing integration complexity, defining interface characteristics, and deriving work items for each user story.

In an embodiment of the present invention, the one or more programs 440 automatically update the process model with the user stories (530). The one or more programs 440 may display the updated process model as a project plan, for example, utilizing a project management software interface (e.g., a project management module, including but not limited to RTC).

In an embodiment of the present invention, the one or more programs 440 select from available resources and associate each user story with an available resource (540). Resources may include entities to which activities in the process model may be assigned, such as a developer or a computing resource. Based on associating a resource with a user story associated with an activity, the one or more program (e.g., an estimation module) update the estimate attributes of the user stories to reflect a timeframe to complete the activities associated with the user stories, based on elements of the user stories and the associated resources (550). Thus, as a resource is assigned to a user story, the one or more programs 440 dynamically create/update the estimate as the estimate is relative to the resource cognition, process context, type context, and feature context.

Figure 7:
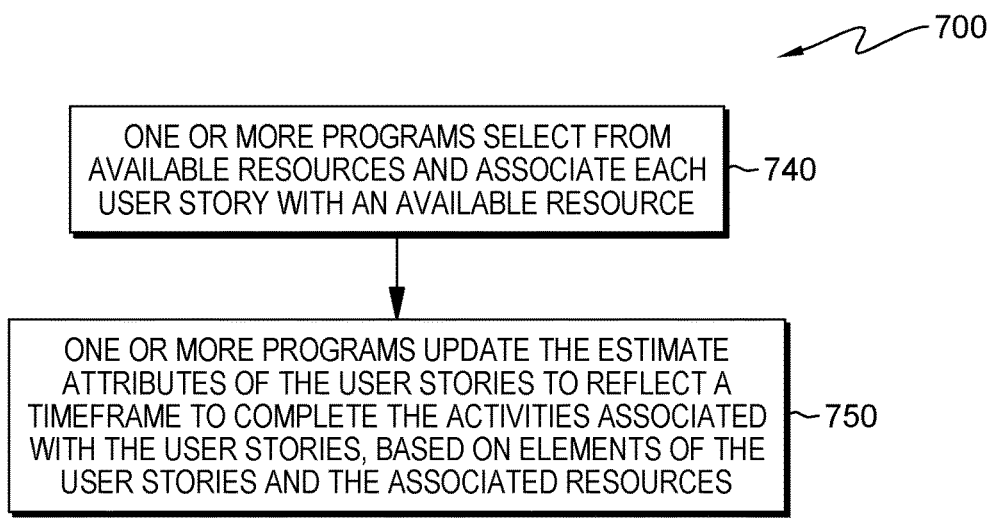
FIG. 7 depicts a workflow that illustrates aspects of an embodiment of the present invention.

FIG. 7 is a workflow 700 that illustrates one specific example of how an embodiment of the present invention can be utilized to dynamically adjust parameters of a process model to effectively "true up" the workflow based on both the activities themselves and the resources assigned to the various activities. Elements of FIGS. 5 and 7 both illustrates aspects of embodiments of the present invention that are relevant to this example. The example of an activity provided in this example is intentionally simplistic for purposes of illustration, but one of skill in the art will appreciate the application of aspects of the present invention to complex activities that comprise complex processes.

In an embodiment of the present invention, an activity that is part of a process model is checking the completeness of a loan form. The activity includes verifying the information in the form is complete such that the process can progress to the next activity, which is property appraisal and risk assessment of the borrowers, or rejection of the application, depending upon the outcome of the present activity. Checking the completeness of a loan form is part of a larger process model. Thus, in an embodiment of the present invention one or more programs 440 generate a process model which includes checking the completeness of a loan form and populates metadata associated with each activity in the business process, including this activity (e.g., FIG. 5, 510). The one or more programs 440 create an activity, checking the completeness of a loan form, which the one or more programs 440 will later map to one or more user stories.

After the one or more programs 440 have generated the model, the one or more programs 440 perform a semantic extraction to convert the process model and the metadata into user stories (e.g., FIG. 5, 520). Semantic extraction can also be understood as semantic analysis and, in this example, from performing this semantic extraction the one or more programs 440 derive that the resource (e.g., loan officer) who performs the activity needs to be part of a team, thus, the one or more program 440 may add a task that impacts the process model to define the process team and assess where the group of users are defined. In this example, the one or more programs 440 may also derive from the semantic analysis that the loan application is the central entity in the process based on the lifecycle of the process. Based on this information and upon the processes utilized to gather and analyze this information, the one or more programs 440 may determine the lifecycle of the loan application, develop an information model for the loan application and its related entities to inform the scope of the business process, and assess the sources of the data utilized in the process. The completeness of a loan form was the item that started the process, but, in an embodiment of the present invention, the one or more program 440 generates the user story that includes a loan officer wanting to verify a loan application is completed so that the process can progress to the property appraisal and financial assessment of the borrowers.

Once the one or more programs 440 generate the user stories, the one or more programs 440 automatically update the process model with the user stories (e.g., FIG. 5, 530).

Referring to FIG. 7, the one or more programs 440 select from available resources and associate each user story with an available resource (740). The one or more program then determines the user story estimation. For the aforementioned story of the loan officer, based on historical data and the loan application being the main entity, the one or more program 440 determines: 1) the information model will include on average six business entities, which include loan application, property borrower, credit report, and account documentation; 2) each entity on average has fifteen attributes so the cost to implement as a business process model (e.g., in a business model product) is two days for a junior developer; 3) the confidence level is 95% and the risk to the model is 10%; 4) the number of data validation rules is approximately thirty and the rules are simple in average at 87% confidence; and 4) the system uses an abacus to derive rule implementation cost. An example of an abacus appears below at Table 1. This is just one example of possible outcomes when utilizing an embodiment of the present invention. In this embodiment of the present invention, the one or more program updates the estimate attributes of the user stories to reflect a timeframe to complete the activities associated with the user stories, based on elements of the user stories and the associated resources (750).

TABLE 1

| | Time Estimate (hours) | | | | |
|---|---|---|---|---|---|
| Rule Type | Total Time | Discovery | Analysis | Authoring | Unit Testing |
| Complex rule archetype | 56 | 2.00 | 2.00 | 0.30 | 2.00 |
| Simple Rule archetype | 35 | 1.00 | 1.00 | 1.00 | 1.00 |
| Rule cloned to m archetype | 06 | 0.25 | 0.00 | 0.25 | 0.10 |

Figure 8:
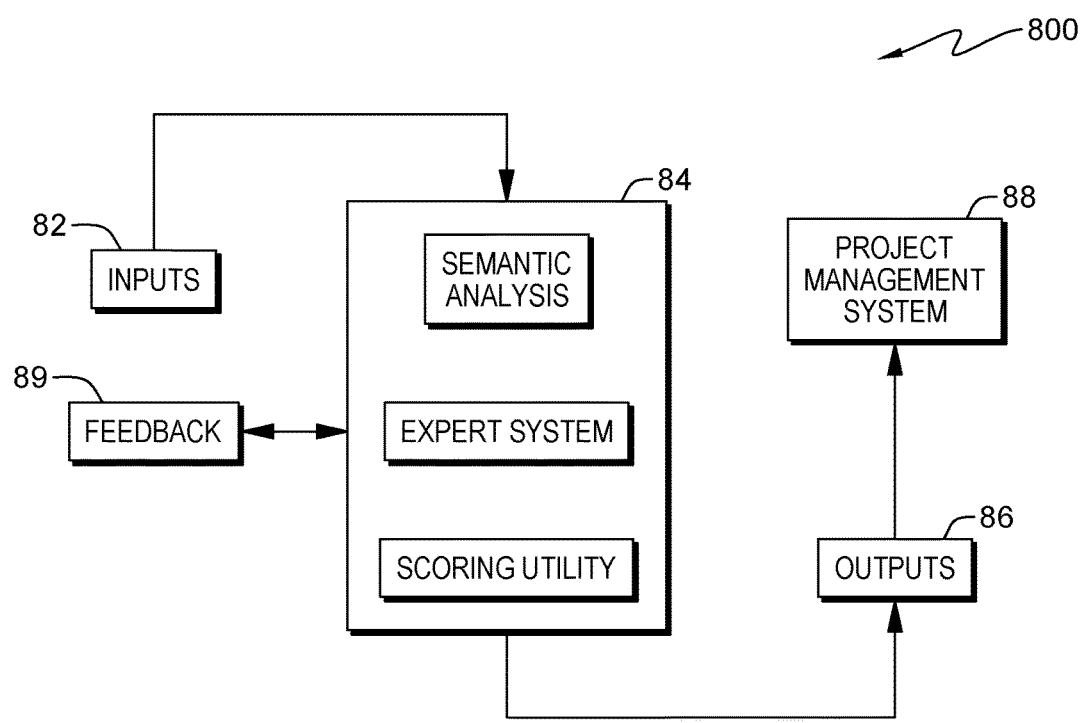
FIG. 8 depicts a block diagram of a context of a system utilizing aspects of an embodiment of the present invention.

FIG. 8 is a block diagram that illustrates a context 800 of a system utilizing an embodiment of the present invention and demonstrates the inputs to the system, the generation of outputs, and how these outputs may be utilized. As illustrated in FIG. 8, inputs 82 into a computer system 84 include BPMN, user stories, and metadata. In an embodiment of the present invention, included in the inputs are texts (e.g., documents) written by non-technical business professionals. These texts may include plain language descriptions of business goals/project plans desired by the professionals for a project (e.g., a product build or the end product itself).

The one or more programs 440 (e.g., FIG. 4) of the system include semantic analysis, an expert system, and a scoring utility. In an embodiment of the present invention, the expert system(s) analyze the inputs and/or the feedback, and one or more programs 440 of the expert system(s) identify a plurality of specific discreet artifacts (e.g., tasks, jobs, actors, individuals, resources) within, needed to complete, or decomposed from, the stated business goals of the process. In an embodiment of the present invention, the expert system(s) include a natural language processing system configured to perform the aforementioned semantic analysis, as well as syntactic analysis, on the texts, to identify specific artifacts.

Outputs 86 include project work items, recommendations, and top 10 items, which can be utilized in project management software 88. In an embodiment of the present invention, the outputs, based on the aforementioned analysis within the computer system 84 may include a map (e.g., a table, a graph) that includes a defined set of artifacts derived from the texts and also including derived links between the artifacts to each other. In an aspect of an embodiment of the present invention the one or more programs 440 may represent the derived links between the current artifacts as flow diagrams, for example, using Business Process Management Notation or Business Process Execution Language standards. The one or more programs 440 present resource cost estimates, which it calculates, as discussed earlier, within a business process model for the project.

As discussed earlier, one or more programs 440 in the scoring utility can assign scores to user stories that reflect risk levels associated with completing the activities associated with the user stories within the predicted timeframes. This accuracy of the scoring utility increases as subsequent processes are modeled by the one or more programs 440 because, in an aspect of certain embodiments of the present invention, during the process, the one or more programs 440 obtain feedback related to the activities. The feedback not only informs the scoring but also informs the values of the resource estimates. In an embodiment of the present invention, the one or more programs 440 obtain this feedback both from human users of the system as well as from historical data.

Human users of the system can provide this feedback 89 and earlier (automatic) estimates for equivalent or similar activities can also comprise feedback 89 that can inform the scoring of subsequent equivalent or similar activities. Thus, the one or more programs 440 continuously obtain feedback from system users or from the previous automated estimation, so its scoring utility is more accurate over time.

To receive feedback 89 from historical data, the one or more programs 440 search, using the map, within a database, which includes historical data. For example, the database may include Business Process Modeling (BPM) data for other historical projects (i.e., projects completed in the past). This historical data may include historical maps of historical projects and resource cost-to-build information (e.g., hours spent in development, etc.) for the historical maps and for historical artifacts within the historical maps. The one or more programs 440 match, based on the search results from the search in the historical data, portions of the map to portions of similar portions of historical maps and based on this matching and other resource cost information, estimating, the resource costs, including the effort needed for the current artifacts within the map.

Figure 9:
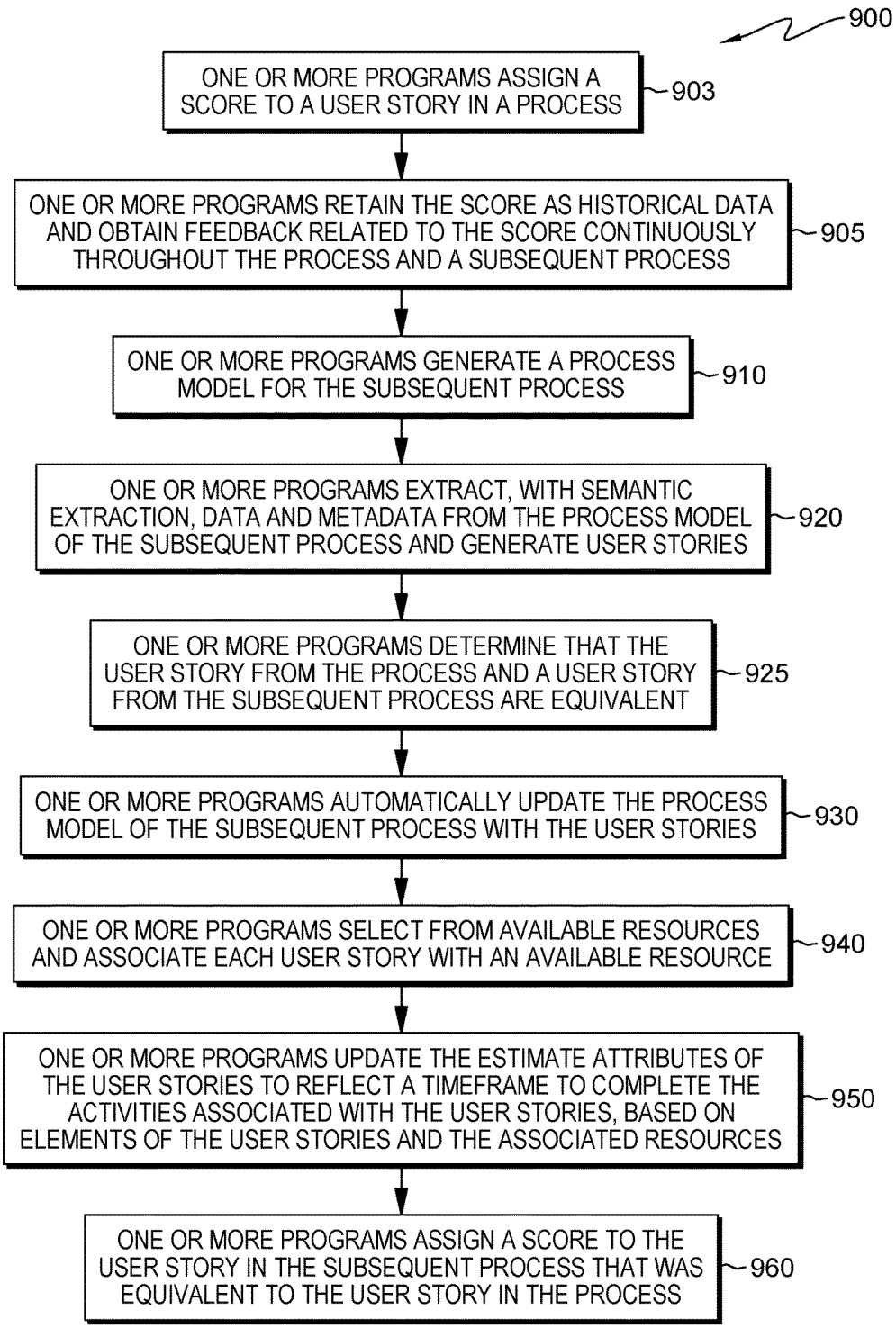
FIG. 9 depicts a workflow that illustrates aspects of an embodiment of the present invention.

FIG. 9 depicts a workflow 900 associated with aspects of the scoring utility in an embodiment of the present invention. In an embodiment of the present invention, the one or more programs 440 assign a score to a user story in a process and this score represents a level of anticipated risk associated with completing the activities associated with this user story within the predicted timeframe (which was determined utilizing aspects of the embodiment of FIG. 5) (903). The one or more programs 440 retain the score as historical data and obtain feedback, including user feedback, related to the score continuously throughout the process and a subsequent process (905). In an embodiment of the present invention, the one or more programs 440 generate a process model for the subsequent process (910). The one or more programs 440 extract, with semantic extraction, data and metadata from the process model of the subsequent process and generate user stories (920). The one or more programs 440 determine that the user story from the process and a user story from the subsequent process are equivalent or similar (925).

In an embodiment of the present invention, the one or more programs 440 automatically update the process model of the subsequent process with the user stories (930). The one or more programs 440 select from available resources and associate each user story with an available resource (940). The one or more programs 440 update the new user story to reflect the new predicted timeframe. The one or more programs 440 assign a score to the user story in the subsequent process that was equivalent or similar to the user story in the process based on the (continuous) feedback and based on the historical data of the user story (960).

Figure 10:
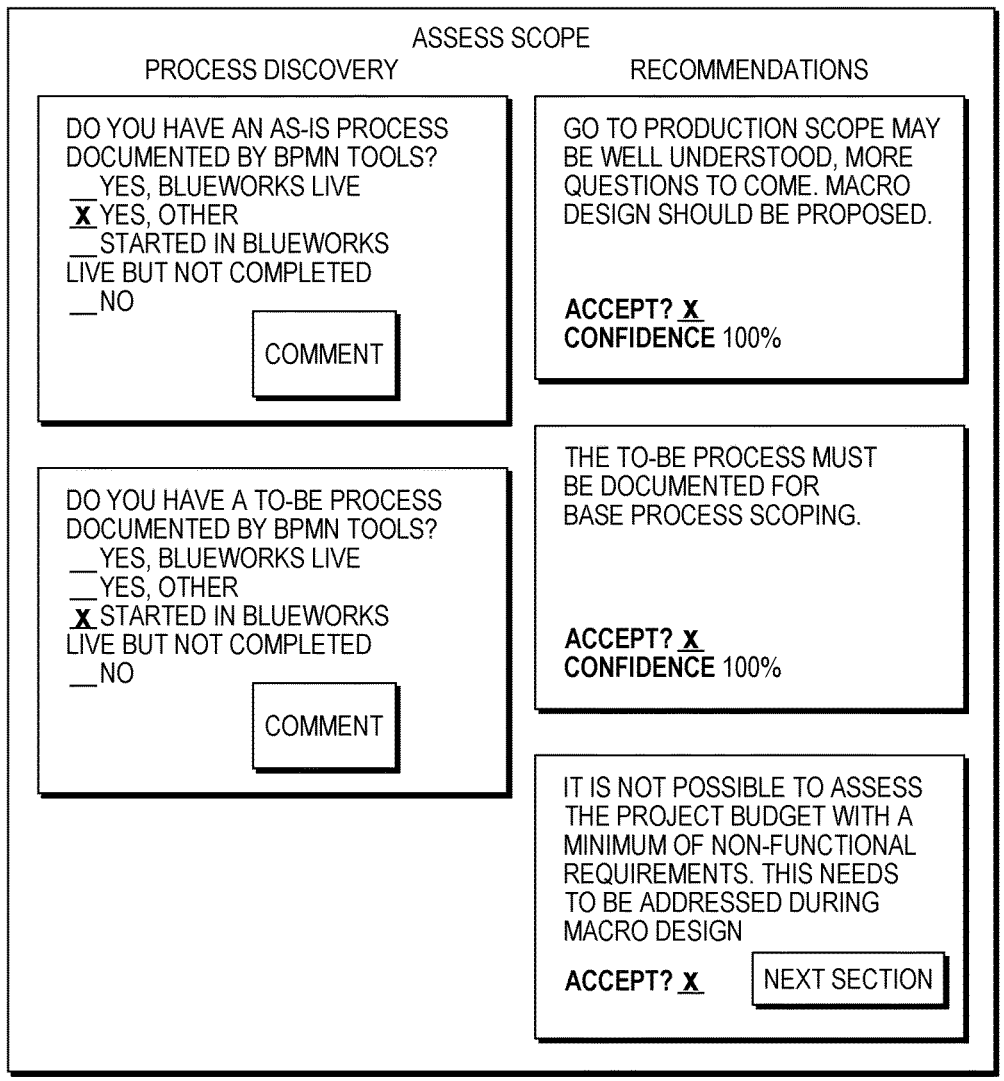
FIG. 10 is an example of a recommendation that one or more programs can generate as results of aspects of embodiments described herein.

FIG. 10 is an example of recommendations 1000 that one or more programs 440 can generate as a result of aspects of the methods described in FIGS. 5-7 and 9. The reference to Blueworks Live in the recommendation refers to IBM Blueworks Live, which is a cloud-based business process modeler. However, as understood by one of skill in the art, this particular software is offered as an example of one process modeler that can be utilized in accordance with aspects of embodiments of the present invention. As aforementioned and illustrated in FIG. 8, the one or more programs 440 obtain feedback throughout the process and can utilize this feedback to improve the quality of estimates. If more information is needed in order to improve the estimates, the one or more programs 440 may obtain this feedback by requesting it through an interface. FIG. 10 depicts an interface 1000 that a user of an embodiment of the present invention can utilize to provide feedback and the one or more programs may utilize both to request and to provide this feedback.

On the left side of the interface 1000 is a "Process Discovery" screen which assists the one or more programs 440 in gaining a deeper understanding of the process that it can eventually model. As discussed earlier, the one or more programs 440 can obtain process information from a variety of sources, including documents, but deriving user stories can be simplified by having a process model already in place with artifacts that are more easily discoverable and ported to a project management system. Thus, on the left side of the interface, the one or more programs 440 obtain information about the type of data that is available. As seen in FIG. 10, the one or more programs 440 solicit feedback related to both the as-is process and the to-be process for a given project. In BPMN, the current process to be enhanced is called as-is process. After it is re-designed, for example, to be more efficient, it is referred to as a to-be process. The to-be process may represent an improvement of the as-is process because, for example, it improves the productivity of the process and/or delivers services more efficiently.

As seen in FIG. 10, the one or more programs 440 may solicit information related to an as-is process representing aspects of a project. In this example, the one or more programs 440 solicit feedback including, "Do you have an as-is process documented by BPMN tools?" The user has indicated, based on the choices, "Yes, Blueworks Live," "Yes, other," "Started in Blueworks Live but not completed," and "No" that there is an as-is process document, but not in Blueworks Live. Thus, the one or more program 440 may have to utilize an NLP program to extract artifacts and links related to the process.

The one or more programs 440 may also solicit information related to the to-be process. The one or more programs in FIG. 10 solicit feedback regarding documentation of the to-be process, specifically, "Do you have a to-be process documented by BPMN tools?" The one or more programs 440 enable the user to select from the choices: "Yes, Blueworks Live," "Yes, other," "Started in Blueworks Live but not completed," and "No." As seen in this example, the user has replied that the process documentation was started by not completed.

Based on the user feedback, the one or more programs 440 perform a contextual evaluation of the process and may update attributes related to project artifacts and identify where information is missing that would enhance the accuracy of the evaluation, if available. As discussed earlier, the one or more programs 440 can provide a project plan as well as tie estimate to elements of the plan, but this is not possible unless the one or more programs 440 obtains the context to make the evaluations and analysis that lead to this level of detail. Thus, as illustrated by FIG. 10, the one or more programs 440 may request additional information from a user and may indicate to the user where more information is required to provide a detailed analysis. In FIG. 10, the one or more programs 440 have indicated that based on the as-is and the to-be process models available, the one or more programs 440 have extrapolated that the production scope may be well understood, but a Macro (i.e., big picture, overview) should be proposed. As indicated in FIG. 10, the one or more programs 440 have made this recommendation with a confidence level of 100% and the user has accepted this recommendation.

The one or more programs 440 have also indicated to the user that the to-be process must be documented for base process scoping. Base process scoping can be understood as determining a scope baseline, which is an approved project scope that is used during scope change management to determine and prevent scope creep. Scope baseline primarily comprises of the project scope statement, work breakdown structure, and Word Breakdown Structure (WBS) dictionary. As indicated in FIG. 10, the one or more programs 440 have made this recommendation with a confidence level of 100% and the user has accepted this recommendation.

The one or more programs 440 have also indicated that based on the information that the user has indicated is available, the one or more programs cannot assess the project budget because there is presently only a minimum of non-functional requirements. The one or more programs 440 have indicated that this issue can be addressed during Macro design, which the one or more programs 440 previously indicated should be a next stage.

The "Next Section" option in FIG. 10 indicates that the one or more programs 440 may solicit additional feedback and offer additional recommendations based on this feedback.

Figure 11:
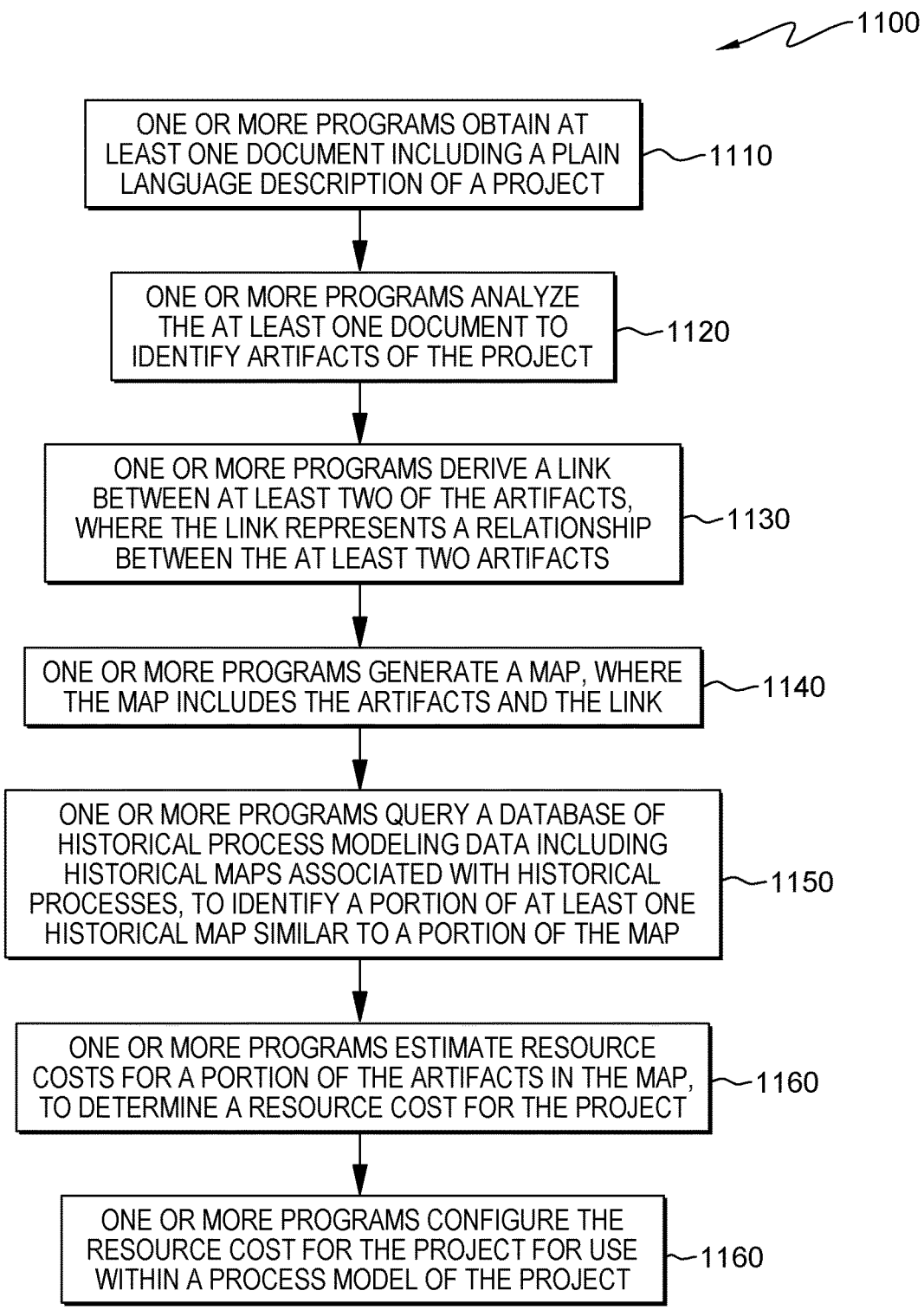
FIG. 11 depicts a workflow that illustrates aspects of an embodiment of the present invention.

FIG. 11 depicts a workflow 1100 of an embodiment of the present invention and illustrates how aspects of this embodiment utilize historical data to improve the quality of a BPM. In an embodiment of the present invention, one or more programs 440 obtains documents that include plain language descriptions of a project (1110). The documents may include texts written by non-technical business professionals that include plain language descriptions of business goals/project plans desired by the professionals for a project (e.g., a product build or the end product itself). In one example, the project may be a software development project and the non-technical business professionals are the individuals who will be using or selling the developed software. The map may be one or more Agile software user story (i.e., a description of a desired software feature from an end-user perspective), and the user stories (described in other figures) and resource cost estimates help a company organize the software development project.

The one or more programs analyze the documents to identify artifacts of the project (1120). The one or more programs 440 may utilize expert systems, including Natural Language Processing (NLP) systems for this analysis. For example, the NLP system may be configured to perform semantic and syntactic analysis on the texts to identify specific artifacts. The project artifacts that the one or more programs 440 identify may include, but are not limited to, tasks, jobs, actors, individuals, and/or resources. Project artifacts may include artifacts within, needed to complete, or decomposed from, the business goals indicated in the documents. Upon identifying the artifacts, the one or more programs 440 derive links between the artifacts (1130). These links may represent the relationships and/or dependencies between individual artifacts.

The one or more programs 440 utilize the artifacts and the links to generate a map, which includes the artifacts and the links representing relationships between certain artifacts (1140). The map can include a table and/or a graph and may represent the links, for example, as flow diagrams using Business Process Management Notation or Business Process Execution Language standards.

The one or more programs 440 query a database of historical business process modeling data, to identify a portion of at least one historical map similar to a portion of the map (1150). In an embodiment of the present invention, the database may contain historical BPM modeling data for other historical (i.e., completed in the past) projects, the historical data including historical maps of historical projects and resource cost-to-build information (e.g., hours spent in development, etc.) for the historical maps and for historical artifacts within the historical maps.

Based on identifying a portion of at least one historical map similar to a portion of the map, the one or more programs 440 estimate, based on resource cost information in the portion of the at least one historical map, resource costs for the artifacts in the map (1160)

The one or more programs 440 configure the resource cost estimates within a business process model (1170), for example, for display in the project management interface.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description set forth herein has been presented for purposes of illustration and description, but is not intended to be exhaustive or limited to the form disclosed. Many modifications and variations will be apparent to those of ordinary skill in the art without departing from the scope and spirit of the disclosure. The embodiment was chosen and described in order to best explain the principles of one or more aspects set forth herein and the practical application, and to enable others of ordinary skill in the art to understand one or more aspects as described herein for various embodiments with various modifications as are suited to the particular use contemplated.

What is claimed is:

1. A method comprising:
   extracting, by one or more processor, with semantic extraction, data and metadata from a model representing a process, wherein the process is comprised of activities and the metadata is associated with each activity;
   based on the semantic extraction, generating, by the one or more processor, at least one user story for at least one activity, wherein the at least one user story comprises an estimate attribute reflecting a predicted timeframe for completion of at least a portion of the at least one activity by a given resource, wherein the estimate attribute is a function of cognition of the given resource related to the at least a portion of the at least one activity by a given resource, wherein the cognition of the given resource is determined by analyzing, by the one or more processors, data extracted in the semantic extraction indicating experience of the given resource with a development platform associated with the at least one portion of the at least one activity, experience of the given resource with a type of artifact created by the at least one activity, commonality of the type of artifact, and an anticipated load of the given resource with respect to the at least one activity, wherein generating the at least one user story comprises:
      determining, by the one or more processor, that the at least one activity in the model is missing a user story related to a given artifact;
      automatically performing, by the one or more processor, a semantic analysis of the given artifact, wherein the artifact is selected from the group consisting of: an intermediate event and a start message event, to generate a user story for the missing user story, wherein the user story for the missing user story comprises the at least one user story;
      based in the determining, automatically updating, by the one or more processor, the model to reflect the at least one user story, the updating comprising displaying the updated model as a project plan in a project management interface on a computing resource;
   assigning, by the one or more processor, a resource to the at least one user story;
   dynamically updating, by the one or more processor, the estimate attribute of the at least one user story to reflect a new predicted timeframe, wherein the dynamic updating is based on attributes of the resource; and
   updating, by the one or more processor, the at least one user story to reflect the new predicted timeframe, calculating impacts to the process, based on the new predicted timeframe, and displaying the impacts and the new predicted timeframe in the project management interface.

2. The method of claim 1, further comprising:
   generating, by the one or more processor, the model, wherein the generating comprises populating the metadata associated with each activity.

3. The method of claim 1, further comprising:
   analyzing, by the one or more processor, the new predicted timeframe relative to attributes of the process and determining, based on new predicted timeframe, a probability that a milestone of the process will be missed; and
   generating, by the one or more processor, a recommendation for a change to the process to decrease the probability; and
   communicating, by the one or more processor, the recommendation by displaying the recommendation in the project management interface.

4. The method of claim 1, wherein the generating the at least one user story is based on a function of at least one attribute of the at least one activity, and wherein the at least one activity comprises a type attribute, an actor attribute, an input attribute, an output attribute, a feature attribute, and a goal attribute.

5. The method of claim 1, wherein the process metadata comprises at least one item selected from the group consisting of: a process item, a process stakeholder, an input for each activity, an output for each activity, and an interface characteristic.

6. The method of claim 1, further comprising:
   based on the semantic extraction, identifying an activity in the process as a message event; and
   displaying, by the at least one or more processor, the message event in the project management interface on the computing resource without generating a user story.

7. The method of claim 1, further comprising:
   based on the semantic extraction, generating, by the one or more processor, a project management artifact relevant to the process.

8. The method of claim 7, wherein the updating the model further comprises updating the model to reflect the project management artifact.

9. The method of claim 8, wherein the artifact comprises one item selected from the group consisting of: a list of development tasks for the process, whether each activity constitutes a risk factor, and a recommendation to increase efficiency.

10. The method of claim 1, further comprising:
assigning, by the one or more processor, another resource to the at least one user story; and
dynamically updating, by the one or more processor, the estimate attribute of the at least one user story to reflect a different predicted timeframe in place of the new predicted timeframe, wherein the dynamic updating is based on attributes of the another resource.

11. The method of claim 1, further comprising:
assigning, by the one or more processor, to the at least one user story, a score, wherein the score represents a level of anticipated risk associated with completing the portion of the at least one activity within the new predicted timeframe.

12. The method of claim 11, further comprising:
obtaining, by the one or more processor, repeatedly during the process, feedback related to the score;
extracting, by one or more processor, with semantic extraction, data and metadata from another model representing a subsequent process, wherein the subsequent process is comprised of additional activities and additional metadata is associated with each additional activity;
based on the semantic extraction, generating, by the one or more processor, at least one new user story for at least one additional activity, wherein the at least one new user story comprises an estimate attribute reflecting a predicted timeframe for completion of at least a portion of the at least one additional activity, and wherein the at least one new user story and the at least one user story are equivalent or similar;
updating, by the one or more processor, the another model to reflect the at least one new user story, the updating comprising displaying the updated another model as another project plan in the project management interface on the computing resource;
assigning, by the one or more processor, a new resource to the at least one new user story;
dynamically updating, by the one or more processor, the estimate attribute of the at least one new user story to reflect a new predicted timeframe of the at least one new user story, wherein the dynamic updating is based on attributes of the new resource;
updating, by the one or more processor, the at least one new user story to reflect the new predicted timeframe of the at least one new user story; and
assigning, by the one or more processor, based on the feedback and based on the score of the at least one user story, to the at least one new user story, a score, wherein the score of the at least one new user story represents a level of anticipated risk associated with completing the portion of the at least one additional activity within the new predicted timeframe of the at least one new user story.

13. A computer program product comprising:
a computer readable storage medium readable by one or more processor and storing instructions for execution by the one or more processor for performing a method comprising:
extracting, by one or more processor, with semantic extraction, data and metadata from a model representing a process, wherein the process is comprised of activities and the metadata is associated with each activity;
based on the semantic extraction, generating, by the one or more processor, at least one user story for at least one activity, wherein the at least one user story comprises an estimate attribute reflecting a predicted timeframe for completion of at least a portion of the at least one activity by a given resource, wherein the estimate attribute is a function of cognition of the given resource related to the at least a portion of the at least one activity by a given resource, wherein the cognition of the given resource is determined by analyzing, by the one or more processors, data extracted in the semantic extraction indicating experience of the given resource with a development platform associated with the at least one portion of the at least one activity, experience of the given resource with a type of artifact created by the at least one activity, commonality of the type of artifact, and an anticipated load of the given resource with respect to the at least one activity, wherein generating the at least one user story comprises:
determining, by the one or more processor, that the at least one activity in the model is missing a user story related to a given artifact;
automatically performing, by the one or more processor, a semantic analysis of the given artifact, wherein the artifact is selected from the group consisting of: an intermediate event and a start message event, to generate a user story for the missing user story, wherein the user story for the missing user story comprises the at least one user story;
based in the determining, automatically updating, by the one or more processor, the model to reflect the at least one user story, the updating comprising displaying the updated model as a project plan in a project management interface on a computing resource;
assigning, by the one or more processor, a resource to the at least one user story;
dynamically updating, by the one or more processor, the estimate attribute of the at least one user story to reflect a new predicted timeframe, wherein the dynamic updating is based on attributes of the resource; and
updating, by the one or more processor, the at least one user story to reflect the new predicted timeframe, calculating impacts to the process, based on the new predicted timeframe, and displaying the impacts and the new predicted timeframe in the project management interface.

14. The computer program product of claim 13, the method further comprising:
generating, by the one or more processor, the model, wherein the generating comprises populating the metadata associated with each activity.

15. The computer program product of claim 13, the method further comprising:
assigning, by the one or more processor, to the at least one user story, a score, wherein the score represents a level of anticipated risk associated with completing the portion of the at least one activity within the new predicted timeframe;
obtaining, by the one or more processor, repeatedly during the process, feedback related to the score;
extracting, by one or more processor, with semantic extraction, data and metadata from another model representing a subsequent process, wherein the subsequent process is comprised of additional activities and additional metadata is associated with each additional activity;

based on the semantic extraction, generating, by the one or more processor, at least one new user story for at least one additional activity, wherein the at least one new user story comprises an estimate attribute reflecting a predicted timeframe for completion of at least a portion of the at least one additional activity, and wherein the at least one new user story and the at least one user story are equivalent or similar;

updating, by the one or more processor, the another model to reflect the at least one new user story, the updating comprising displaying the updated another model as another project plan in the project management interface on the computing resource;

assigning, by the one or more processor, a new resource to the at least one new user story;

dynamically updating, by the one or more processor, the estimate attribute of the at least one new user story to reflect a new predicted timeframe of the at least one new user story, wherein the dynamic updating is based on attributes of the new resource;

updating, by the one or more processor, the at least one new user story to reflect the new predicted timeframe of the at least one new user story; and assigning, by the one or more processor, based on the feedback and based on the score of the at least one user story, to the at least one new user story, a score, wherein the score of the at least one new user story represents a level of anticipated risk associated with completing the portion of the at least one additional activity within the new predicted timeframe of the at least one new user story.

16. The computer program product of claim 13, the method further comprising:

analyzing, by the one or more processor, the new predicted timeframe relative to attributes of the process and determining, based on new predicted timeframe, a probability that a milestone of the process will be missed; and generating, by the one or more processor, a recommendation for a change to the process to decrease the probability; and communicating, by the one or more processor, the recommendation by displaying the recommendation in the project management interface.

17. The computer program product of claim 13, wherein the generating the at least one user story is based on a function of at least one attribute of the at least one activity, and wherein the at least one activity comprises a type attribute, an actor attribute, an input attribute, an output attribute, a feature attribute, and a goal attribute.

18. The computer program product of claim 13, the method further comprising:

assigning, by the one or more processor, another resource to the at least one user story; and dynamically updating, by the one or more processor, the estimate attribute of the at least one user story to reflect a different predicted timeframe in place of the new predicted timeframe, wherein the dynamic updating is based on attributes of the another resource.

* * * * *